United States Patent [19]

Caywood

[11] 3,934,161
[45] Jan. 20, 1976

[54] ELECTRONIC SHUTTER FOR A CHARGE-COUPLED IMAGER

[75] Inventor: John Millard Caywood, Richardson, Tex.

[73] Assignee: Texas Instruments Incorporated, Dallas, Tex.

[22] Filed: Apr. 29, 1974

[21] Appl. No.: 465,198

[52] U.S. Cl............... 307/311; 178/7.1; 250/211 J; 307/221 D; 357/24; 357/30
[51] Int. Cl.² ........................................ H01L 31/08
[58] Field of Search .. 307/221 D; 178/7.1, DIG. 29; 250/211 R, 211 J; 315/169 TV, 169 R; 340/173 LS; 357/24, 30

[56] References Cited
UNITED STATES PATENTS

| | | | |
|---|---|---|---|
| 3,390,273 | 6/1968 | Weckler | 307/311 X |
| 3,715,485 | 2/1973 | Weimer | 178/DIG. 29 |
| 3,771,149 | 11/1973 | Collins et al. | 340/173 LS |
| 3,801,884 | 4/1974 | Sequin | 307/221 D |

*Primary Examiner*—George H. Libman
*Attorney, Agent, or Firm*—Harold Levine; James T. Comfort; Gary C. Honeycutt

[57] ABSTRACT

The disclosure relates to a system for controlling the total charge collected on a charge-coupled imager to, in effect, provide an electronic shuttering action for the charge-coupled imager. The charge-coupled imager works in standard fashion and is normally biased into depletion whereby minority carriers, generated by the light impinging on the imager, are collected in predetermined charge collecting areas or wells, the charges in each well then bring read out in a serial fashion. In order to prevent collection of an excess number of charges, which is equivalent to overexposure in a photographic sense, the majority carriers which are necessarily generated simultaneously with the minority carriers, are collected and integrated so that when a predetermined amount of charge is measured, a shuttering action can take place. When the basic imager is formed from p-type silicon, the majority carrier charges are collected by providing an ohmic contact to the p-type substrate. Two modes ofoperation are disclosed. The first mode is suitable for imaging applications and the second mode is suitable for laser warning receivers.

19 Claims, 5 Drawing Figures

ELECTRONIC SHUTTER FOR A CHARGE-COUPLED IMAGER

This invention relates to a system of limiting charge accumulation in a charge-coupled imager and, more specifically, to a system for preventing the further accumulation of charge in a charge-coupled imager after a predetermined charge level has been obtained.

Charge-coupled devices are metal-insulated-semiconductor devices which belong to a general class of semiconductor charge devices which store and transfer information in the form of electrical charge. The charge-coupled devices are distinguished by the property that the semiconductor portion of the devices is, for the most part, homogeneously doped, regions of different conductivity being required only for injecting or extracting charge. A typical semiconductor charge-coupled device shift register is described in an article of Boyle et al, Bell System Technical Journal 49, 587 (1970). In the shift register, a dc bias sufficient to invert the semiconductor surface is applied between electrodes and the semiconductor material, and clocking pulses are applied sequentially to the electrodes. Because of the inversion of the semiconductor surface, minority carriers are drawn to the semiconductor insulator interface and tend to collect in the potential wells under the electrodes. When the clocking pulses are sufficiently large, the minority carriers migrate from the area under one electrode to the area under the next electrode following a potential well produced by the clocking pulses.

The charge-coupled device may advantageously be utilized as an optical imager. Bertram, "Application of the Charge-Coupled Device Concept to Solid-State Image Sensors," 1971 IEEE International Convention, March 22-25, New York, N.Y., describes such a charge-coupled imager which includes an optical integration section and a separate storage section. Charge-coupled imagers are also set forth in an article by M. F. Tompsett, entitled "Charge-Transfer Devices," Journal of Vacuum Science and Technology, Vol. 9, No. 4, July–August, 1972, as well as in an article of M. F. Tompsett et al, entitled "Charge-Coupling Improves Its Image, Challenging Video Camera Tubes," Electronics, Jan. 18, 1973, pps. 162–169. A problem which has been encountered with such charge-coupled device imagers is that they are presently unable to operate over a wide range of light intensities. Such imagers can be designed to have good sensitivity at low light levels, but they quickly saturate at high light levels. This problem can be alleviated by operating the imager at a very high frame rate, however this requires a large power expenditure.

Briefly, in accordance with the present invention, the above noted problems of the prior art are substantially over come. In order to prevent collection of an excess number of charges, which is equivalent to over-exposure in a photographic sense, the majority carriers are collected and integrated so that when a predetermined amount of charge is measured, a shuttering action can take place. When the basic imager is formed from p-type silicon, the majority carrier charges are collected by providing an ohmic contact to the p-type substrate. Two modes of operation are disclosed. One mode is with the charge-coupled device initially biased into accumulation. The device is then biased into depletion whereby the wells of charge are biased as they would be for integration. The charge carriers collected in the depletion wells at this time induce a current in the ground line through the substrate bulk. When the appropriate charge is moved along the ground line, the information in the depletion wells is shifted into a storage register for interrogation at the appropriate time and the imager returns to accumulation. In the second mode, the imager is initially biased into depletion (integration mode) until the proper amount of charge has moved along the ground line. The imager is either pushed into accumulation long enough for the collected charge to be pushed into the substrate bulk and then removed or the collected information is shifted into the storage register. The difference between the two modes is that in the first mode the imager is normally in accumulation and comes into depletion only long enough to collect the desired amount of photons from the scene, while in the second mode the imager is normally integrating and goes into accumulation only long enough to dispose of unwanted charge. The first mode is suitable for imaging applications and the second mode is suitable for laser warning receivers.

It is therefore an object of this invention to provide a charge-coupled device imager which is capable of operation over a wide range of light intensities.

It is a further object of this invention to provide a charge-coupled device imager having a sensor system which will place the imager into accumulation when a predetermined charge has been accumulated thereon.

It is a yet further object of this invention to provide a charge-coupled device imager having an electronic shutter coupled thereto to prevent more than a predetermined charge to collect thereon.

The above objects and still further objects of the invention will immediately become apparent to those skilled in the art after consideration of the following preferred embodiments thereof, which are provided in way of example and not by way of limitation; wherein FIG. 1 is a schematic diagram of a prior art charge-transfer image sensing array having an optical integration or imager section and a read-out storage section;

Figure 1:
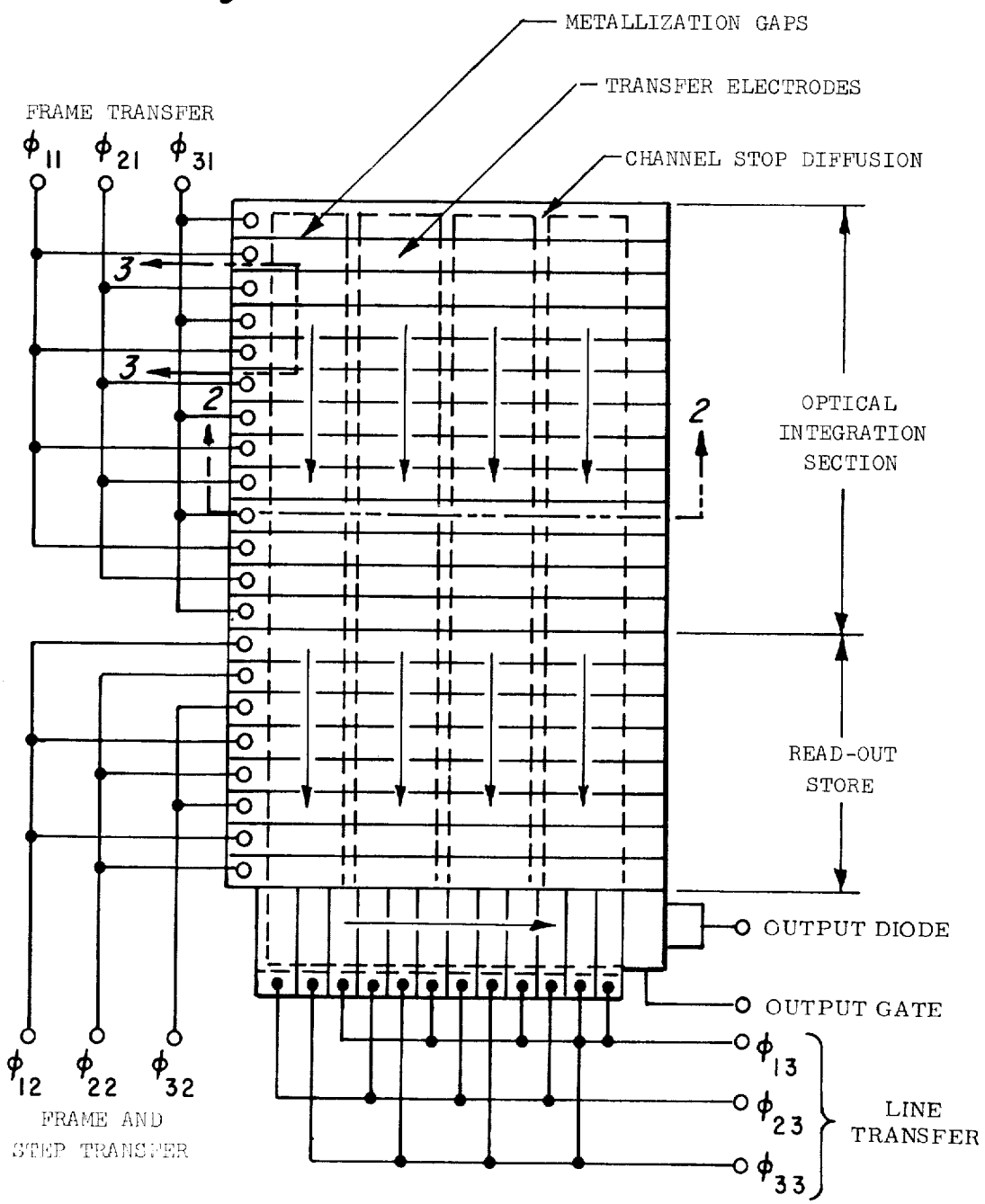

Referring first to FIG. 1, there is shown a schematic diagram of the "frame-transfer" method of organizing a charge-transfer image sensing array as set forth in the above noted article from the Journal of Vacuum Science and Technology. The array includes, in the optical integration section, frame transfer lines $\phi_{11}$, $\phi_{21}$, and $\phi_{31}$ which provide the well-known three phases of transfer as discussed in the above noted articles, the metallization gaps, the transfer electrodes and the channel diffusion stops between the rows of transfer electrodes. The portion of the array labelled "read-out store" includes frame and step transfer inputs $\phi_{12}$, $\phi_{22}$, and $\phi_{32}$ as well as line transfer inputs $\phi_{13}$, $\phi_{23}$, and $\phi_{33}$, an output diode and an output gate. In conjunction with the phase transfer signals, charge stored under designated electrodes in the optical integration section can be transferred in a shift register manner as is well-known in the art into the read-out store section prior to read out through the output diode and the output gate. The specific operation of this device will not be discussed herein since the operation thereof is well-known in the art and fully described in the above noted literature. As previously noted, when the optical integration section has an excessive amount of light impinging thereon, an excessive amount of charge is stored up under the transfer electrodes, thereby quickly saturating the frames of the optical integration section and providing little differentiation between different light levels. The result, in effect, is the same as an overexposed photograph. It is therefore necessary that some type of shuttering operation be provided, wither to prevent the excessive amount of light from falling on the optical integration section, or alternatively, to prevent an excessive buildup of charges when an excessive amount of light falls thereon, thereby providing the same effect as a camera shutter.

Figure 2:
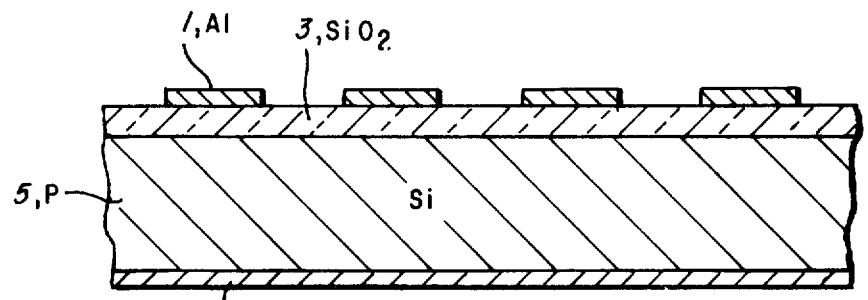
FIG. 2 is a cross-section of a first embodiment of a charge-coupled imager which would be substituted for the image sensing array of FIG. 1 and is shown when substituted in FIG. 1 along the line 2—2 of FIG. 1.

One method of overcoming this problem is shown with reference to FIG. 2. Here, one embodiment of the optical integration section of FIG. 1 is shown in cross-section. It will be seen that whereas the normal prior art optical integration section will have the transfer electrodes 1 as well as a silicon dioxide layer 3 thereunder which is positioned over a substrate 5 of p-type silicon, there is added a further n+ region 7 on the bottom side of the silicon substrate. When the embodiment of FIG. 2 is substituted for the optical integration section of FIG. 1, the optical integration or imager section integrates for the desired period and then shifts the image into the storage section as determined by the frame transfer and frame and step transfer signals of FIG. 1. During the integration and shifting period, the n+ region 7 and a contact thereto (not shown) is open-circuited so that it collects no charge except that generated within the n+ region itself or the depletion region arising from the built-in potential. After another integration period, bias is applied to the MOS field plates to drive them into accumulation while the n+ junction is reversed biased. The minority carriers collected under the field plates diffuse across the bulk of the substrate. After the minority carriers are collected by the n+ region, the field plates are biased to recreate depletion wells while the $n+$ contact is open-circuited again. This dumping action can be repeated until, after a field-time, the buffer register or read-out store is empty and the integrated charge is shifted into the buffer rather than dumped. An alternative mode of operation is to leave the field plates biased to accumulation except for one integration field per field period when the information is collected. The system for enabling this function to be performed in conjunction with the embodiment of FIGS. 1 and 2 will be discussed hereinbelow.

Figure 3:
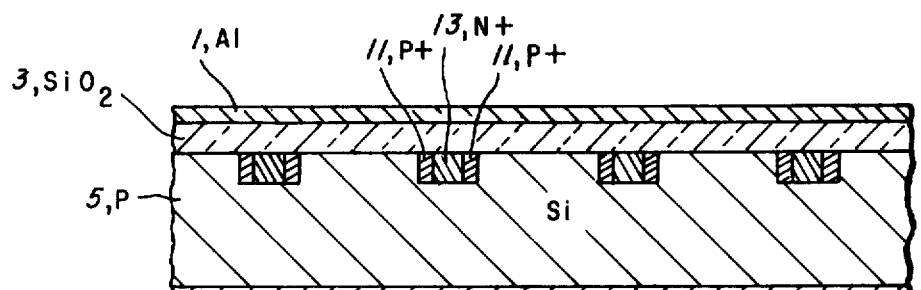
FIG. 3 is a cross-section of a second embodiment of a charge-coupled imager which would be substituted for the image sensing array of FIG. 1 and is shown when substituted in FIG. 1 along the line 3—3 of FIG. 1.

Referring now to FIG. 3, there is shown a further embodiment of the present invention. The embodiment of FIG. 3 is a cross-sectional view of the optical integration section and is used in lieu of the optical intergration section of FIG. 1. FIG. 3 is shown in a direction turned 90° to that of FIG. 2. FIG. 3 includes the aluminum metallization 1 positioned over a silicon dioxide insulating layer 3, the insulating layer being positioned over a substrate 5 of p-type silicon. A p+ region 9 is positioned on the bottom surface of the substrate 5. The p+ channel stops 11 are shown with n+ channels 13 diffused into the centers of the channels stops. These n+ channels are kept reverse-biased at all times. The channels act as the carrier sinks if the field plates are biased to accumulation to provide dumping of charge. The embodiment of FIG. 3 provides an additional advantage in that it inherently incorporates blooming control. Blooming occurs when the light focused on one resolution element generates, in one integration period, more than enough carriers to fill a depletion well. The excess carriers then spill over into adjacent wells. If the channel stops are not too heavily doped, that is in the range of $10^{16}$/centimeter$^3$, the potential barrier of the channel stop is less than the barrier erected along the channel by the containing electrodes and the excess carriers spill into the n+ drains or channels 13 rather than into the adjacent wells.

Figure 4:
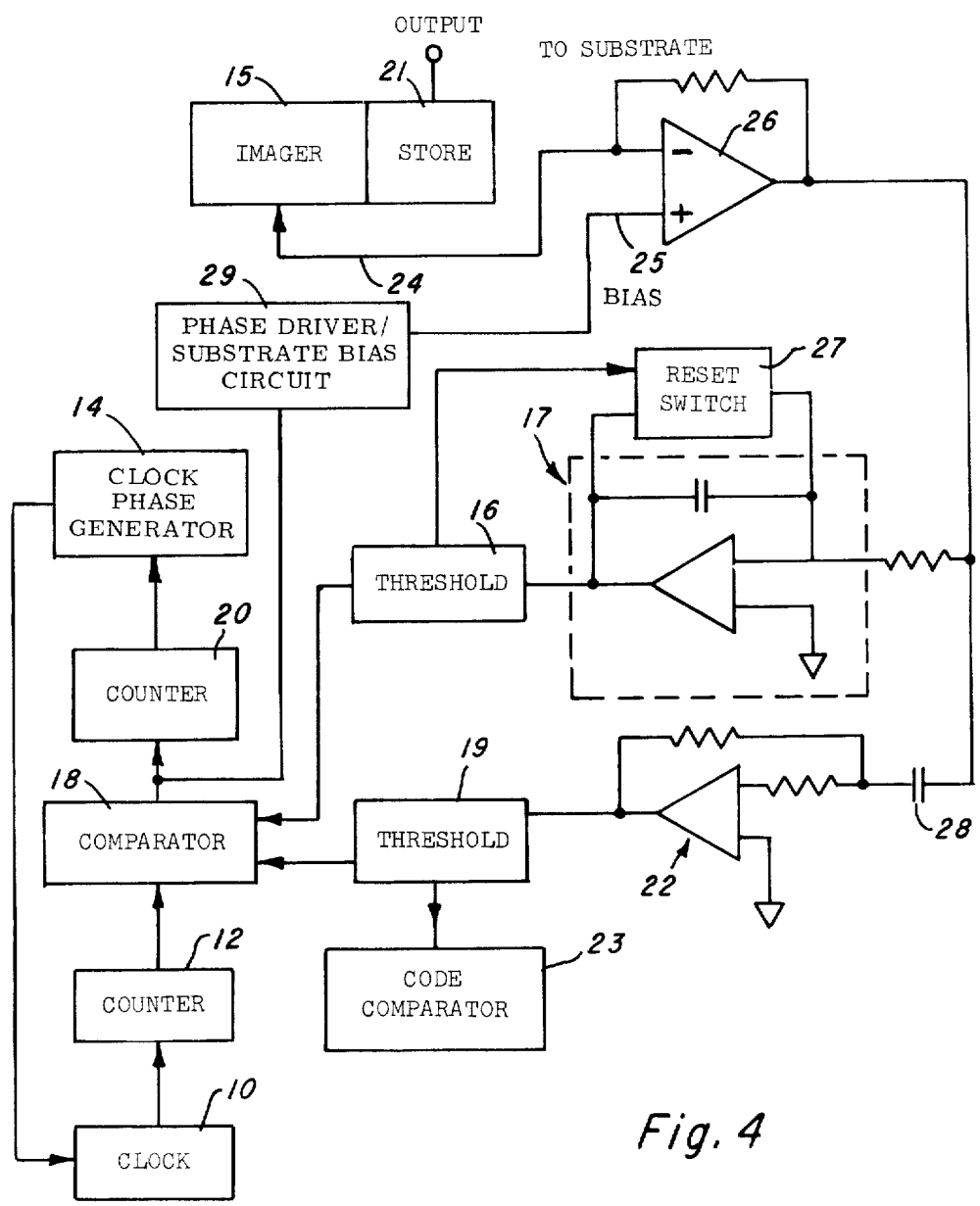
FIG. 4 is a block diagram of a charge-coupled imager with automatic sensitivity control and laser pulse detection.

Referring now to FIG. 4, there is shown a block diagram of a system incorporating the embodiments of FIGS. 2 or 3 above in a system of the type shown in FIG. 1. FIG. 4 is a block diagram of a charge-coupled imager with automatic sensitivity control and laser pulse detection for use with the embodiments of FIGS. 2 or 3. The charge-coupled device includes an imager portion 15 and a storage portion 21 which are equivalent to the optical integration section and read-out store sections of FIG. 1, respectively as modified by FIGS. 2 and/or 3. A lead 24 is coupled to the p+ region 9 of FIG. 3 or would be coupled to the top surface of the substrate 5 in the embodiment of FIG. 2 by a small p+ region (not shown) formed to the top surface therein. Substrate bias is applied to the imager 15 from an accumulation biasing circuit 29 via a bias current detecting operational amplifier 26. Any charge passing to the lead 24 from the small p+ region (not shown) of the embodiment of FIG. 2 or the region 9 of the embodiment of FIG. 3 will pass through the amplifier 26 to an integrator 17 having a reset switch 27 thereacross. The output of the integrator 17 is coupled to a threshold device 16 which is triggered when the integrator 17 has stored a predetermined charge to provide a signal to a comparator 18. The threshold device 16 also operates the reset switch 27 which then discharges the capacitor of the integrator and starts the integrator back from a zero condition. Actuation of the comparator 18 causes a counter 20 to start to count down for a number of counts equal to the number of transfers required to transfer all of the charge stored in all of the wells in the imager 15 into the store 21. The counter will enable a phase-line driver 14 in conjunction with a clock 10 to provide these frame transfer signals to the inputs $\phi_{11}$, $\phi_{21}$, $\phi_{31}$, $\phi_{12}$, $\phi_{22}$, and $\phi_{32}$ as shown in FIG. 1. The clock 10 also provides pulses through a counter 12 which is set to provide a reference frame whereby, at the end of the predetermined period, whether the threshold device 16 or the threshold device 19 has been operated, the charge stored in the imager 15 will be transferred to the store 21. An amplifier 22 is utilized in the event that a very high intensity short-term pulse is provided along the line 24 from the imager 15. This amplifier would come into operation, for example, if a very large intensity pulse from a laser or the like were to impinge on the imager 15. This pulse will pass through the capacitor 28, since only AC will be able to pass through amplifier 22, and, if sufficient intensity, will operate the threshold device 19 to then operate the comparator 18 as described above. The threshold device 19 also can provide the signals thereto to a code comparator 23 to determine whether a plurality of laser pulses are in accordance with a predetermined code. At the end of a field time, a signal from the counter 12 will reset the comparator 18 and the counter 20 to allow the transfer electrodes to again be biased for depletion.

To follow the circuit of FIG. 4 for a cycle of high illuminance, if it is assumed that the cycle begins with a pulse from the counter 12, then the imager 15 begins integrating and, after collecting the proper amount of charge, the threshold of the integrator 17 is reached. The charge packets in the depletion wells are shifted quickly from the imager 15 into the buffer or store section 21 under control of the comparator 18, counter 20 and phase line driver 14 and the integrator 17 is reset by a signal from threshold device 16 to the reset switch 27. The imager 15 integrates again, and again the threshold detector 16 is tripped. If a field time has passed, the comparator 18 has received another pulse from the counter 12 and the imager charge packets are shifted into the buffer or store 21 even if they have not been previously shifted. If a field time has not elapsed, the comparator 18 directs the imager 15 to dump the charge. The output of the threshold detector 19 in the pulse detection chain acts as a priority interrupt, causing this image containing the laser spot to be shifted into the empty buffer register even though a field time has not elapsed.

As an alternative to dumping, when the charge is stored in the imager 15 or transferred to the store 21 for the first time during a field time, the imager 15 will then be biased into accumulation rather than depletion. This situation will continue until the end of the field time at which time the imager 15 will be biased into depletion or for integration and the operation will continue as set forth herein above. In this way, the imager 15 will not be able to store any charge after the initial operation during the field time.

In this case, the comparator 18 will direct the phase driver/substrate bias circuit 29 to bias the imager 15 into accumulation so that the imager 15 will store no further charge until a pulse from the counter 12 indicates to the comparator 18 that the field time has elapsed.

The imager 15 can be accumulated by either inhibiting all of the phase drivers so that the phase lines are approximately at ground and biasing the substrate a few volts positive or by leaving the substrate bias constant and causing the inhibit signal to drive the phase lines a few volts more negative than the substrate bias. A circuit for providing the latter function is illustrated in FIG. 5.

Figure 5:
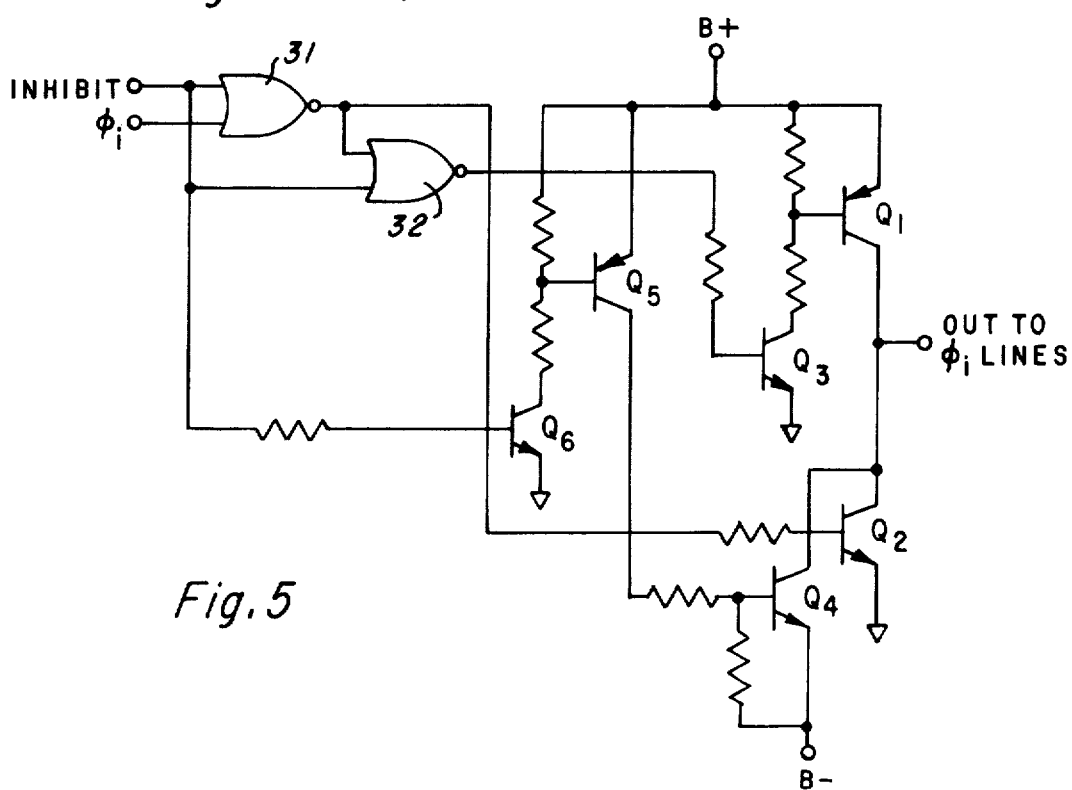
FIG. 5 is a typical accumulation biasing circuit of FIG. 4 which can be used.

When the inhibit line of the circuit shown in FIG. 5 is a logical 0, toggling the $\phi_i$ input toggles the $\phi_i$ output. For example, when the $\phi_i$ input is a 0, the output of the NOR gate 31 is a 1 so that the output of NOR gate 32 is a 0. Thus, the transistor $Q_1$ is cut off and the transistor $Q_2$ is turned on, thereby putting the output to the $\phi_i$ lines approximately at ground. Conversely, when the $\phi$ input is a 1, the output of NOR gate 31 goes to 0 and the output of NOR gate 32 goes to 1. This turns on transistor $Q_1$ and turns off transistor $Q_2$ so that the $\phi_i$ output goes to approximately B+ volts. If the inhibit line goes to a 1, the output of NOR gate 31 becomes 0 and the output of NOR gate 32 becomes 0 regardless of the state of the $\phi_i$ input. Thus, the inhibit 1 keeps the transistor $Q_1$ cut off while at the same time it turns on the transistor $Q_4$ which pulls the output to approximately B-- volts.

It can be seen that there have been provided means for controlling the amount of charge that can be collected on a charge-coupled imager to prevent the effect of overexposure and lack of definition in the final image.

Through the invention has been described with respect to specific preferred embodiments thereof, many variations and modifications thereof will immediately become apparent to those skilled in the art. It is therefore the intention that the appended claims be interpreted as broadly as possible in view of the prior art to include all such variations and modifications.

What is claimed is:

1. An electronic shutter for a charge-coupled imager which comprises, in combination:
   a. a charge-coupled imager comprising a substrate of semiconductor material of predetermined conductivity type, an insulating layer on a surface of said substrate, and plural transfer electrodes over said insulating layer such that radiation incident on said imager causes generation of minority carrier-majority carrier pairs in said substrate for storage of minority-carrier charge beneath said transfer electrodes during an integration period;
   b. storage means coupled to said imager; and
   c. means electrically connected to said substrate for responding to current flow induced by said majority carriers to cause transfer to said storage means of said minority carrier induced charge stored beneath said transfer electrodes and for terminating said integration period, at a predetermined level of said current.

2. An electronic shutter as set forth in claim 1, further including means responsive to said majority-carrier-induced current for biasing said imager into accumulation.

3. An electronic shutter as set forth in claim 1, further including means for setting a field time period and further means responsive to said majority-carrier-induced current during a field time for dumping further minority carrier charge stored in said imager.

4. An electronic shutter as set forth in claim 1, wherein said charge-coupled imager further includes a layer of conductivity type opposite from said substrate on the opposite surface of said substrate.

5. An electronic shutter as set forth in claim 2, wherein said charge-coupled imager further includes a layer of a conductivity type opposite from said substrate on the opposite surface of said substrate.

6. An electronic shutter as set forth in claim 3, wherein said charge-coupled imager further includes a layer of a conductivity type opposite from said substrate on the opposite surface of said substrate.

7. An electronic shutter as set forth in claim 1, wherein said charge-coupled imager further includes a plurality of substantially parallel and spaced apart channels in one surface of said substrate of the same conductivity type as said substrate and more highly doped than said substrate, a channel within each of said spaced apart channels and extending to the surface of said substrate of opposite conductivity type than said substrate, said plural transfer electrodes extending normal to said channels.

8. An electronic shutter as set forth in claim 2, wherein said charge-coupled imager further includes a plurality of substantially parallel and spaced apart channels in one surface of said substrate of the same conductivity type as said substrate and more highly doped than said substrate, a channel within each of said spaced apart channels and extending to the surface of said substrate of opposite conductivity type than said substrate, said plural transfer electrodes extending normal to said channels.

9. An electronic shutter as set forth in claim 3, wherein said charge-coupled imager further includes a plurality of substantially parallel and spaced apart channels in one surface of said substrate of the same conductivity type as said substrate and more highly doped than said substrate, a channel within each of said spaced apart channels and extending to the surface of said substrate of opposite conductivity type than said substrate, said plural transfer electrodes extending normal to said channels.

10. An electronic shutter as set forth in claim 7, further including a layer of the same conductivity type as said substrate but more highly doped than said substrate on the opposite surface of said substrate.

11. An electronic shutter as set forth in claim 8, further including a layer of the same conductivity type as said substrate but more highly doped than said substrate on the opposite surface of said substrate.

12. An electronic shutter as set forth in claim 9, further including a layer of the same conductivity type as said substrate but more highly doped than said substrate on the opposite surface of the said substrate.

13. An electronic shutter for a charge-coupled imager having a substrate of semiconductor material of predetermined conductivity type, an insulation layer on one surface thereof, and a plurality of spaced transfer electrodes disposed on said insulation layer, such that radiation incident on said imager causes generation of minority carrier-majority carrier pairs in said substrate for storage of minority-carrier charge beneath said transfer electrodes during an integration period, said electronic shutter comprising:
 a. storage means coupled to said imager;
 b. substrate bias circuit means having a bias line connected to said substrate such that said majority carriers induce corresponding current flow in said bias line during operation of said imager; and
 c. control means operably connected to said substrate bias circuit means for controlling said substrate bias circuit means in response to a predetermined level of majority carrier induced current flow in said bias line corresponding with a predetermined level of radiation incident on said imager, so as to impart bias to said substrate in a manner regulating charge transfer from said imager to said storage means.

14. An electronic shutter for a charge-coupled imager having a substrate of semiconductor material of predetermined conductivity type, an insulation layer on one surface thereof, and a plurality of spaced transfer electrodes disposed on said insulation layer, said electronic shutter comprising:
 a. charge storage means coupled to said imager;
 b. substrate bias circuit means having a bias line connected to said substrate and being responsive to current induced in said bias line by majority carriers generated in the operation of said imager; and
 c. control means operably connected to said substrate bias circuit means for controlling said substrate bias circuit means so as to impart bias to said substrate in a manner regulating charge transfer from said imager to said storage means, said control means comprising:

i. an integrator circuit connected to said bias line for receiving current therefrom,
 ii. a threshold device connected to the output of said integrator circuit and being responsive to an output of a predetermined magnitude to generate a threshold signal, and
 iii. a comparator connected to the output of said threshold device and being actuated upon receiving a threshold signal therefrom to provide an output signal, and
 iv. said substrate bias circuit means being connected to said comparator and being responsive to an output signal therefrom for imparting bias to said substrate so as to transfer charge represented by minority carriers collected by said imager from said imager to said storage means.

15. An electronic shutter as set forth in claim 14, wherein said control means further comprises
 a. a counter connected to said comparator and also being responsive to an output signal therefrom for counting a total count number equal to the number of charge transfers required to transfer all of the charge represented by minority carriers collected by said imager from said imager to said storage means,
 b. a phase-line driver connected to the output of said counter and operably associated with said spaced transfer electrodes of said imager, and
 c. said counter enabling said phase-driver upon implementation of each count to sequentially provide transfer signals from said phase line driver to said imager so as to transfer all of the charge respresented by minority carriers collected by said imager from said imager to said storage means.

16. An electronic shutter as set forth in claim 14, further including reset switch means connected across said integrator circuit, said reset switch means also being connected to the output of said threshold device and being responsive to a threshold signal generated therefrom for discharging said integrator circuit to return said integrator circuit to a start condition.

17. An electronic shutter as set forth in claim 14, wherein said control means further comprises
 a. high intensity pulse signal detecting means connected to said bias line in parallel with said integrator circuit for receiving high intensity short-duration pulses from said bias line,
 b. a second threshold device connected to the output of said high intensity pulse signal detecting means and being responsive to an output of a predetermined magnitude therefrom to generate a threshold signal, and
 c. said comparator being connected to the output of said second threshold device and being actuated upon receiving a threshold signal therefrom to provide an output signal.

18. In a charge coupled device imager which comprises, in combination, a substrate of semiconductor material of predetermined conductivity type, an insulating layer on a surface of said substrate, and plural transfer electrodes over said insulating layer such that radiation incident on said imager causes generation of minority-carrier majority-carrier pairs in said substrate for storage of minority-carrier charge beneath said transfer electrodes during an integration period:
 incident radiation sensing means comprising means electrically coupled to said substrate for responding to current flow induced by said majority-carriers to measure the amount of radiation incident upon said imager.

19. In a charge coupled device imager which comprises, in combination, a substrate of semiconductor material of predetermined conductivity type, an insulating layer on a surface of said substrate, and plural transfer electrodes over said insulating layer such that radiation incident on said imager causes generation of minority carrier majority carrier pairs in said substrate for storage of minority-carrier charge beneath said transfer electrodes during an integration period: incident radiation sensing means comprising means electrically coupled to said substrate for response to current flow induced by said majority carriers to measure the amount of radiation incident upon said imager; and means operatively coupled to said incident radiation sensing means for terminating said integration period at a predetermined incident radiation level thereby providing automatic exposure control for said imager.

* * * * *